(12) United States Patent
Pal

(10) Patent No.: US 9,991,655 B2
(45) Date of Patent: Jun. 5, 2018

(54) CONTACTOR IN POWER DISTRIBUTION ASSEMBLY

(71) Applicant: HAMILTON SUNDSTRAND CORPORATION, Charlotte, NC (US)

(72) Inventor: Debabrata Pal, Hoffman Estates, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days. days.

(21) Appl. No.: 15/196,749

(22) Filed: Jun. 29, 2016

(65) Prior Publication Data

US 2018/0006413 A1    Jan. 4, 2018

(51) Int. Cl.
| | | |
|---|---|---|
| H01R 12/00 | (2006.01) | |
| H01R 25/16 | (2006.01) | |
| H05K 7/20 | (2006.01) | |
| H01R 31/06 | (2006.01) | |

(52) U.S. Cl.
CPC ....... *H01R 25/162* (2013.01); *H05K 7/20154* (2013.01); *H01R 31/06* (2013.01)

(58) Field of Classification Search
USPC .......................................... 439/75, 654, 843
See application file for complete search history.

(56) References Cited

U.S. PATENT DOCUMENTS

| | | | |
|---|---|---|---|
| 3,453,587 A | 7/1969 | Neidecker | |
| 4,627,677 A | 12/1986 | Ono et al. | |
| 4,906,211 A | 3/1990 | Bell et al. | |
| 7,557,445 B2 * | 7/2009 | Choi | H01L 23/49811 174/138 D |
| 7,834,447 B2 | 11/2010 | Karavakis et al. | |
| 7,837,496 B1 * | 11/2010 | Pal | H01R 9/2466 361/712 |
| 7,857,669 B1 | 12/2010 | Wavering | |
| 8,057,269 B2 * | 11/2011 | Ledermann | H01R 13/187 439/827 |
| 9,142,364 B2 | 9/2015 | Pal | |
| 9,153,946 B2 | 10/2015 | Pal | |
| 9,613,764 B1 * | 4/2017 | Pal | H01H 1/62 |
| 2001/0019923 A1 | 9/2001 | Moll et al. | |
| 2014/0002995 A1 * | 1/2014 | Pal | H01H 1/62 361/712 |
| 2014/0087584 A1 * | 3/2014 | Pal | H02B 1/056 439/485 |

(Continued)

FOREIGN PATENT DOCUMENTS

| | | |
|---|---|---|
| EP | 2680289 A1 | 1/2014 |
| GB | 2265769 A | 10/1993 |
| WO | 2011063627 A1 | 6/2011 |

OTHER PUBLICATIONS

EP Communication; Extended European Search Report; Application No. 17178738.5-1808; dated Nov. 6, 2017; pp. 1-9.

*Primary Examiner* — Tho D Ta
(74) *Attorney, Agent, or Firm* — Cantor Colburn LLP

(57) ABSTRACT

An electrical contactor assembly includes an electrical contactor having an electrical lead having a contactor pin extending therefrom, an electrical bus bar, and at least one post extending between the electrical contactor and the electrical bus bar. The post is constructed from an electrically and thermally conductive material. The post includes an opening for receiving the contactor pin and the opening includes a contactor-foil material disposed in contact with the pin.

11 Claims, 5 Drawing Sheets

(56) References Cited

U.S. PATENT DOCUMENTS

2014/0334074 A1* 11/2014 Pal .................... H05K 7/20154
                                                            361/676
2015/0194797 A1    7/2015  Horowy et al.
2015/0287657 A1   10/2015  Debabrata et al.
2016/0028216 A1    1/2016  Pal et al.

* cited by examiner

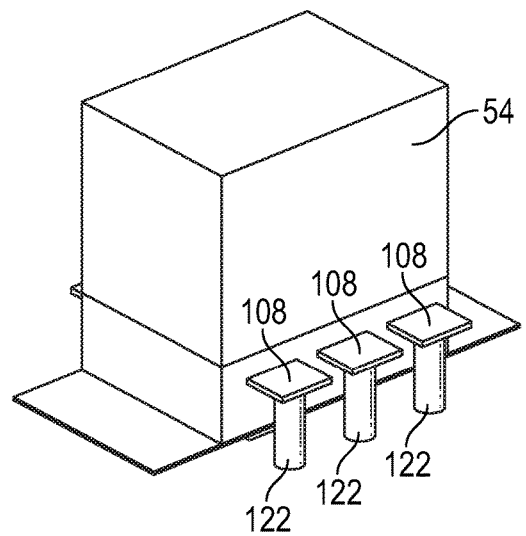
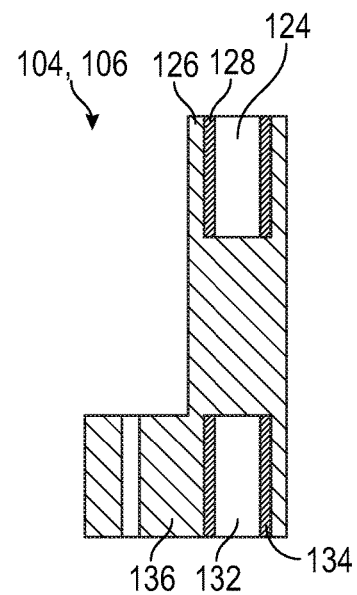
FIG. 5    FIG. 6
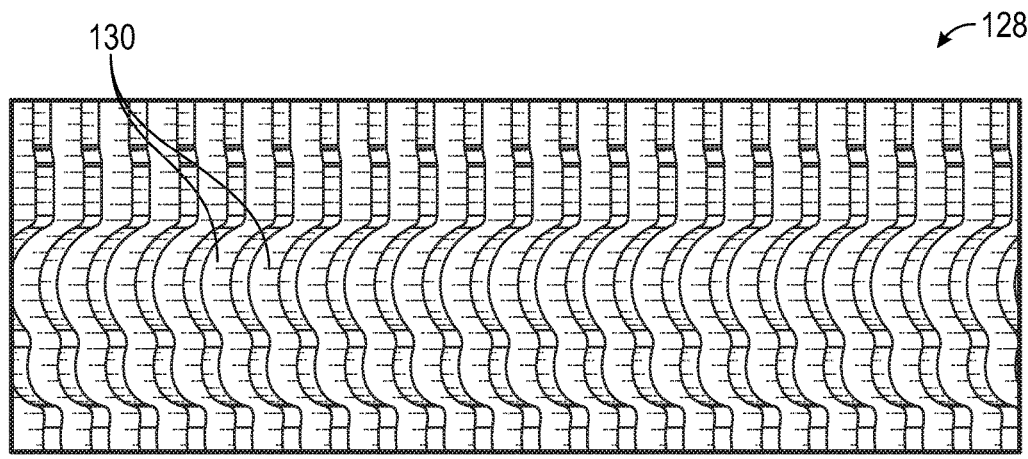
FIG. 7

CONTACTOR IN POWER DISTRIBUTION ASSEMBLY

BACKGROUND OF THE INVENTION

This invention generally relates to the field of electrical contactors and, more particularly, to a heat sink for dissipating heat generated by an electrical contactor connected to a mounting panel.

Contactor assemblies are used in electrical applications, such as aircraft power distribution systems, where power and current flow control of a multi-phase power distribution system is required. A contactor assembly typically has a panel on which several electrical contactors are mounted. Known mounting assemblies used to mount electrical contactors to the panels are constructed of thermally and electrically resistive materials, such as plastics or FR-4 for example.

Each of the contactors is connected to an electrical bus bar with a plurality of mounting posts such that current flows through the contactor and the corresponding bus bar whenever the contactor is in a closed position. In conventional assemblies, electrical leads extending from the contactor are arranged in contact with an adjacent end of the mounting posts to electrically and thermally couple the contactor to the bus bars. Imperfections in the contact surfaces of the leads and mounting posts may result in inconsistency in the voltage drop and therefore increased electrical resistance between the contactor and the bus bar. As a result, this variability can add to the amount of waste heat generates that needs to be dissipated.

BRIEF DESCRIPTION OF THE INVENTION

According to one embodiment, an electrical contactor assembly includes an electrical contactor having an electrical lead having a contactor pin extending therefrom, an electrical bus bar, and at least one post extending between the electrical contactor and the electrical bus bar. The post is constructed from an electrically and thermally conductive material. The post includes an opening for receiving the contactor pin and the opening includes a contactor-foil material disposed in contact with the pin.

According to an alternate embodiment of the invention, a mounting post of a contactor assembly includes a body having a first end configured to couple to an electrical contactor and a second end configured to couple to a bus bar. The body includes an opening having a contactor-foil material disposed therein for contacting a portion of the electrical contactor and the bus bar receivable therein.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

FIG. 5 is a perspective view of a contactor of the contactor assembly according to an embodiment;
FIG. 6 is a side view of a mounting post of the contactor assembly according to another embodiment;
and
FIG. 7 is a top view of an example of a contactor foil material according to an embodiment.

DETAILED DESCRIPTION OF THE INVENTION

Figure 1:
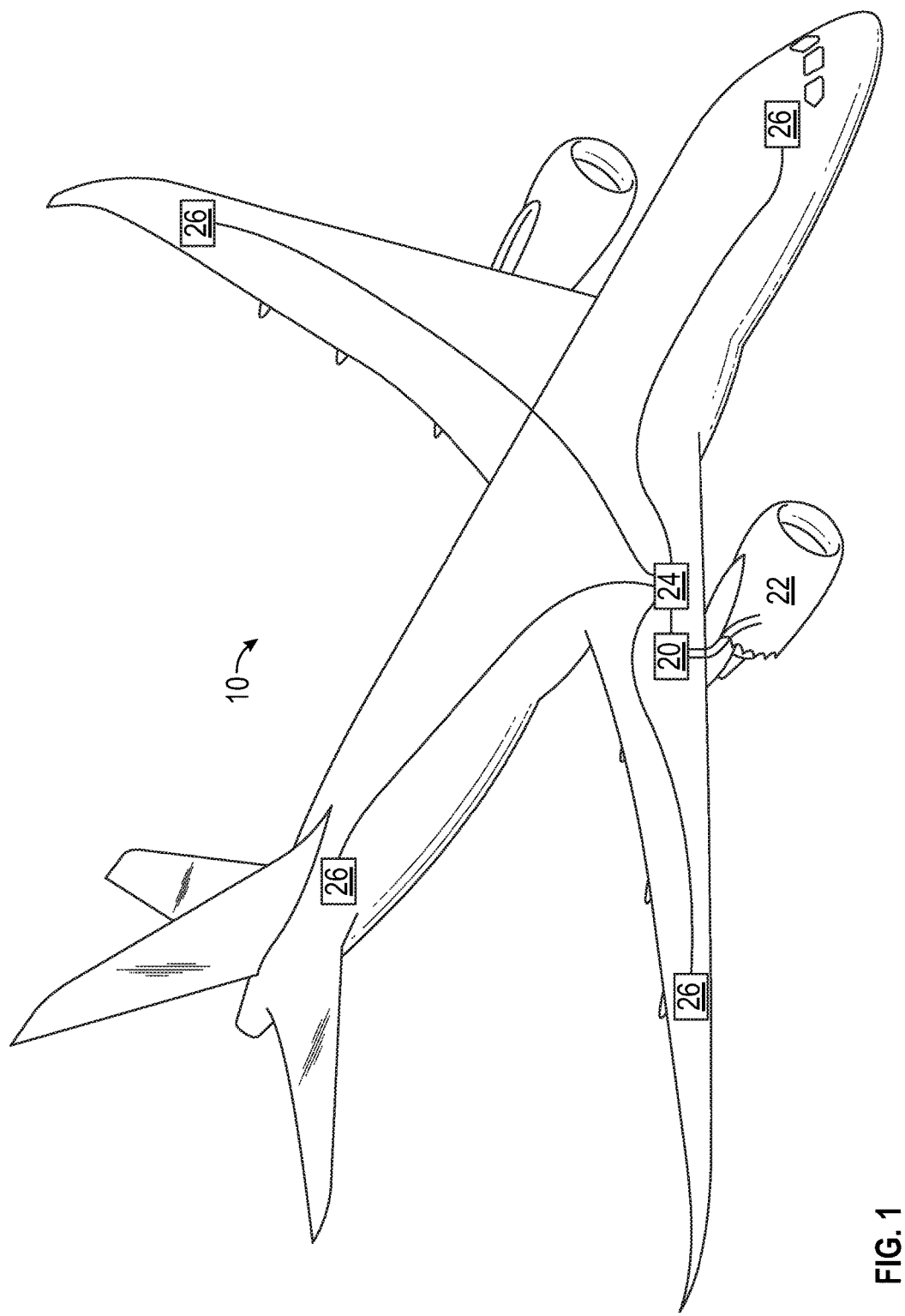
FIG. 1 is a schematic diagram of an aircraft.

Referring now to FIG. 1, an exemplary aircraft 10 including an electrical power distribution system is illustrated. The aircraft 10 includes a power generation system 20, which utilizes rotation within the jet engines 22 to generate either single phase or three phase electrical power. The power is sent to a panel box 24 that contains multiple electrical buses and contactor assemblies 100 for controlling how the power is distributed throughout the aircraft 10. Through the use of the electrical contactor assemblies 100, power may be controlled for each onboard electrical system 26 independently.

Figure 2:
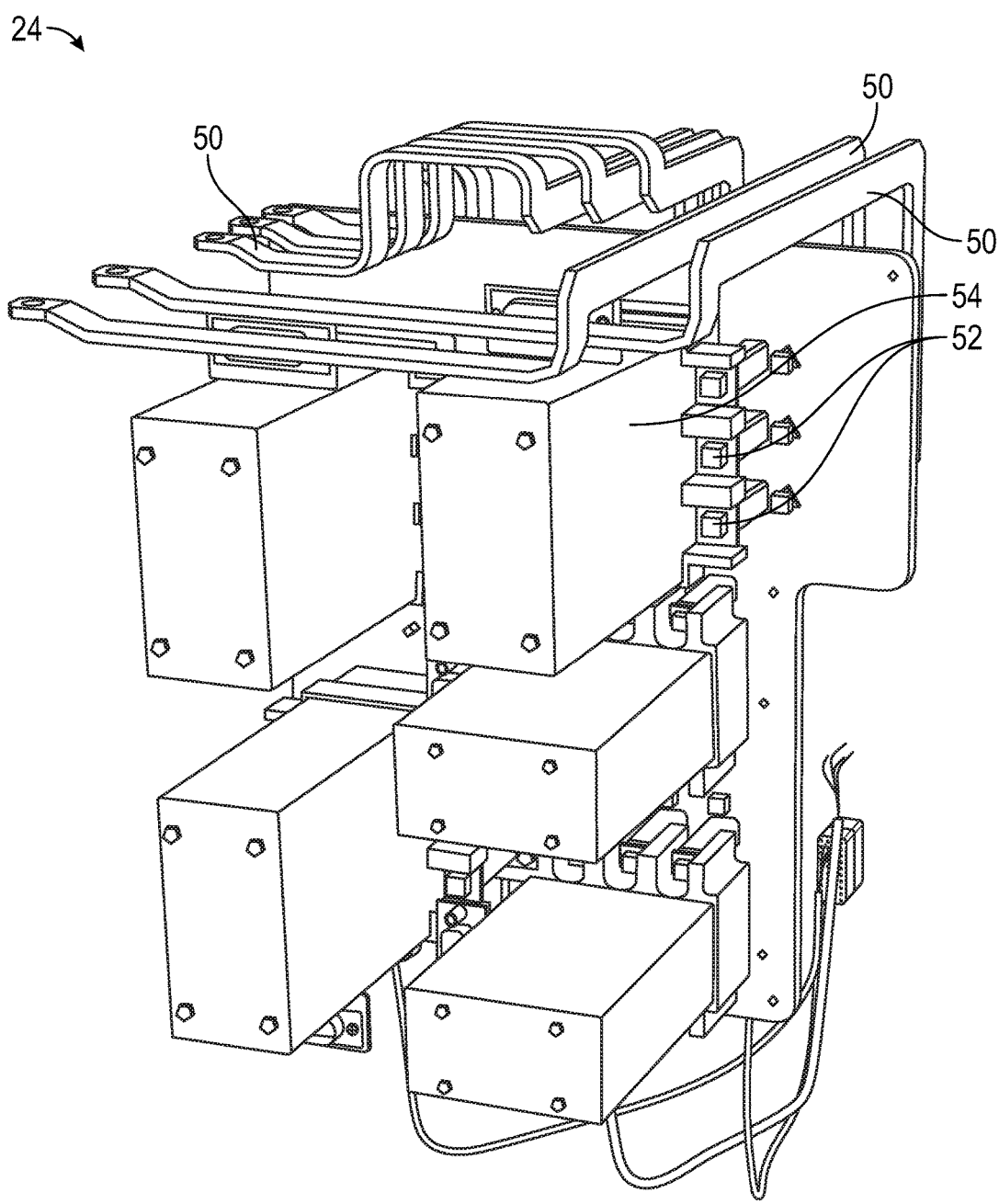
FIG. 2 is a schematic diagram of a portion of an exemplary power distribution network.

An example of the interior of a panel box 24 is illustrated in FIG. 2. The interior of the panel box 24 has multiple electrical bus bars 50, which are interrupted by electrical contactor connections 52. When the contactor connections 52 are closed, electrical current and heat are allowed to flow between the connected bus bars 50 and a contactor 54. In known systems, all of the excess heat generated in the contactors 54 is transmitted to the bus bars 50 for dissipation by radiation into the ambient atmosphere.

Figure 3:
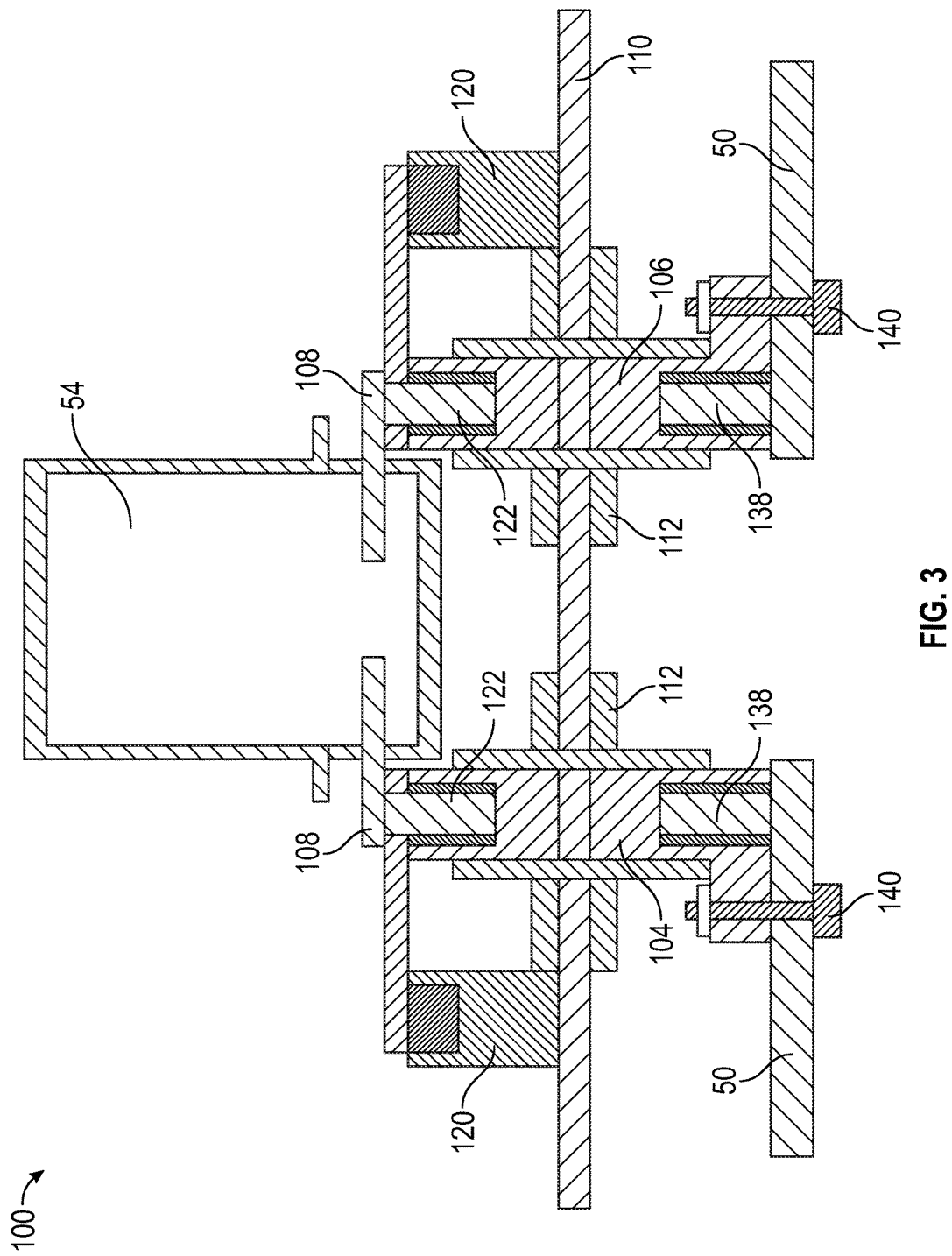
FIG. 3 is a cross-section of a contactor assembly in a power distribution network according to an embodiment.
Figure 4:
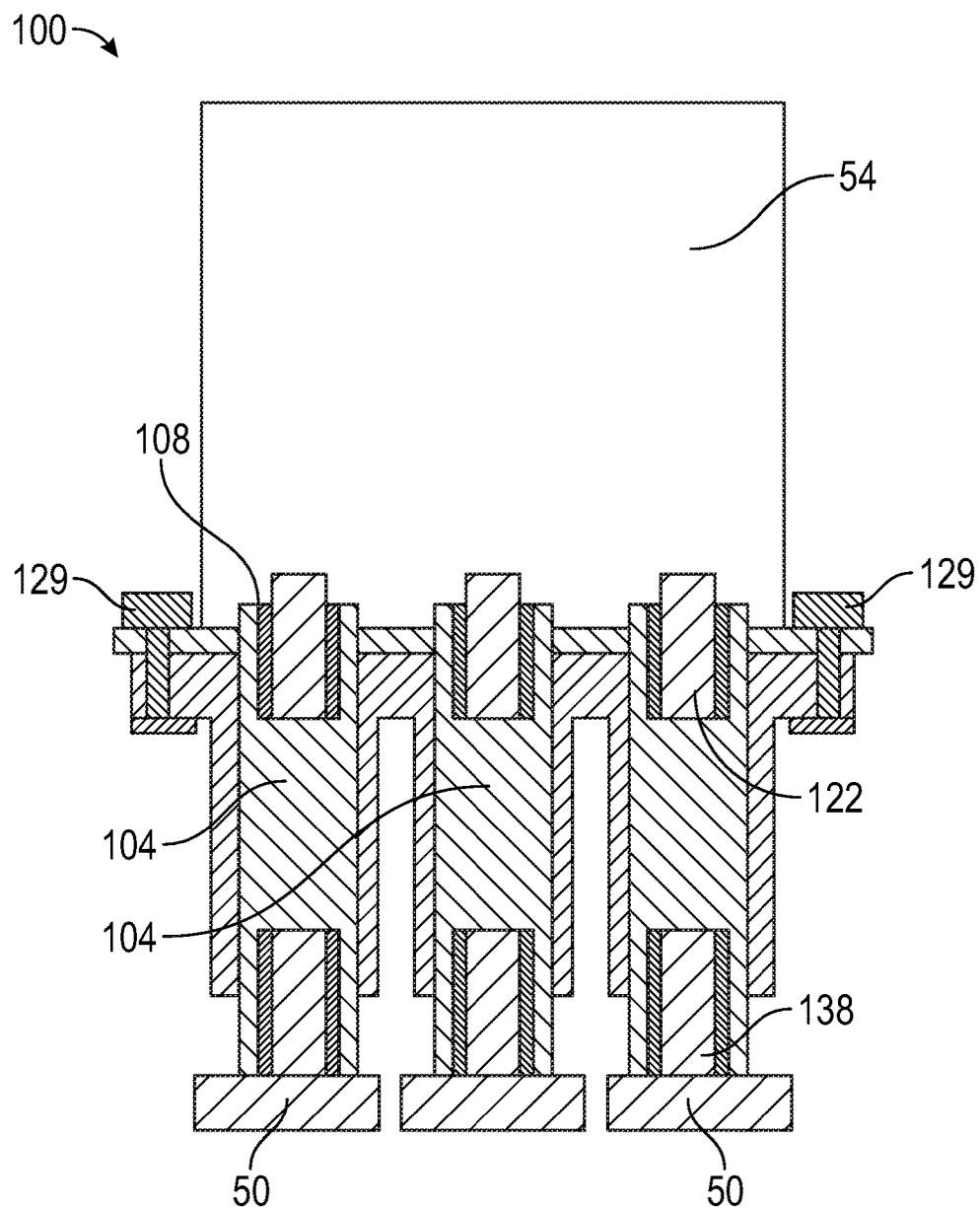
FIG. 4 is a side view of the contactor assembly of FIG. 3 according to an embodiment.

Referring now to FIGS. 3 and 4, an example of a contactor assembly 100, for connecting an electrical contactor 54 to at least one bus bar 50, is illustrated. The contactor assembly 100 has at least one post 104 for connecting a contactor 54 to a first side of a bus bar 50 and at least one post 106 for connecting the contactor 54 to a second side of a bus bar 50. The electrical contactor 54 connects to the posts 104, 106 of the contactor assembly 100 via a set of electrical leads 108 using known thermal and electrical connection techniques. The posts 104, 106 are electrically and thermally coupled to the bus bars 50. The contactor assembly 100 additionally includes a panel 110 including multiple holes (not shown) through which the posts 104, 106 extend. In one embodiment, the posts 104, 106 are in direct contact with the panel 110. A structural support 112 is positioned at the interface between the posts 104, 106 and the panel 110 to mechanically fasten each post 104, 106 to the panel 110. In one embodiment, fasteners, such as screws for example, connect the structural support 112 to the panel 110. Alternatively, the structural supports 112 may be configured with a snap fit construction.

In the illustrated, non-limiting embodiment, one or more heat sinks 120 (FIG. 3) are mounted to the panel 110 to facilitate heat dissipation from the assembly 100. Incorporation of at least one heat sink 120 having multiple fins or heat transfer surfaces increases the surface area exposed to the ambient atmosphere. In combination, the heat dissipated by the bus bars 50 and the at least one heat sink 120 results in a higher heat generation tolerance for the contactor 54. However, it should be understood that inclusion of the heat sink 120 is not mandatory for operability of the contactor assembly 100.

With reference now to FIGS. 5 and 6, the connection formed between the contactor 54 and the mounting posts 104, 106 are illustrated and described in more detail. As shown in FIG. 5, a cylindrical pin 122 is electrically coupled to each of the plurality of electrical leads 108 extending from the contactor 102. Although the illustrated, non-limiting embodiment includes a single pin 122 associated with each electrical lead 108, embodiments including a plurality of cylindrical pins associated with an electrical lead 108 are also within the scope of the disclosure. The cylindrical pins 122 may be formed from any electrically conductive material, such as aluminum or copper for example, and may be connected to the leads 108 via any suitable process including, but not limited to soldering, brazing, and welding for example.

An opening 124 corresponding to each of the pins 122 is formed in the upper surface 126 of the mounting posts 104, 106. Wrapped about at least a portion of the interior periphery of each opening 124 is a contact foil material 128. An example of a contact foil material 128 is illustrated in more detail in FIG. 7. As shown, the contact foil material 128 has a relatively thin thickness and includes a plurality of fins or teeth 130 that protrude generally perpendicularly from a surface of the material 128.

The inner diameter of the contactor-foil material 128 is slightly smaller than the outer diameter of the cylindrical pins 122 extending from the electrical leads 108. As a result, when the contactor 54 is mounted to the mounting posts 104, 106 by inserting the cylindrical pins 122 into the corresponding openings 124, the plurality of fins 130 of the contactor foil material 128 engage and form several points of contact with the cylindrical pins 128. In the illustrated, non-limiting embodiment, the contactor 54 is illustrated as being vertically stacked relative to the mounting posts 104, 106 and the bus bar 50. However, the contactor assembly 100 may have another orientation, such as shown in FIG. 2 where the bus bar 50 is arranged within a vertical plane and the mounting posts 104, 106 extend generally horizontally between the bus bars 50 and the contactor 54 for example. One or more fasteners 129 (FIG. 4), such as screws or bolts for example, may be used to couple a portion of the contactor 54 to an adjacent portion of the mounting posts 104, 106 to maintain the position of the contactor 54 relative to the assembly 100.

In an embodiment, a similar type of connection is formed between the bus bars 50 and each of the mounting posts 104, 106. As shown, openings 132 having a contactor-foil material 134 wrapped about an inner periphery are formed in the portion of the mounting posts 104, 106 adjacent the bus bar 50, such as the lower surface 136 thereof for example. Pins 138 complementary to the openings 132, extend from the bus bar 50 and are each received within a corresponding opening 132 to electrically and thermally couple the fins of the contact foil material 134 and the pin 138. Alternatively, or in addition, one or more fasteners 140, such as shown in FIG. 3 for example, may be used to could the bus bar 50 to a corresponding mounting post 104, 106.

This type of electrical connection formed between contactor pin 122 and mounting post 104, 106 will provide a good connection in the event of any misalignment in the contactor leads 108 relative to each other. The disclosed interface provides two electrical connections with the bus bars 50. The first connection occurs between the foil material 134 on the posts 104, 106 and the pin 138 of the bus bar 50. The second connection occurs between the surface of the posts 104, 106 and the surface of the bus bar 50. In this manner, redundant electrical connection is established, resulting in a reduced voltage drop across the post 104, 106 to bus bar connection and thereby lower heat dissipation.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An electrical contactor assembly comprising:
   an electrical contactor including an electrical lead having a contactor pin extending therefrom;
   an electrical bus bar including a bus bar pin;
   at least one post constructed from an electrically and thermally conductive material, the at least one post extending between and being coupled to the electrical contactor and the electrical bus bar with at least one fastener, the at least one post including an opening for receiving the contactor pin and a bus bar opening for receiving the bus bar pin; and
   a contactor foil material arranged within the opening in contact with the pin and within the bus bar opening in contact with the bus bar pin, wherein the contactor-foil material includes a plurality of fins extending at an angle to a surface of the contactor-foil material.

2. The electrical contactor assembly according to claim 1, wherein the contactor-foil material is arranged about an inner periphery of the opening.

3. The electrical contactor assembly according to claim 1, wherein an inner diameter of the contactor-foil material is equal to or smaller than an inner diameter of the pin.

4. The electrical contactor assembly according to claim 1, wherein the contactor-foil material includes an aluminum or copper material.

5. The electrical contactor assembly according to claim 1, wherein the plurality of fins form a plurality of points of contact between the pin and the post.

6. The electrical contactor assembly according to claim 1, further comprising a panel formed from an electrically insulating material.

7. The electrical contactor assembly according to claim 6, further comprising a structural support positioned at the interface between the at least one post and the panel to mechanically fasten the at least one post to the panel.

8. The electrical contactor assembly according to claim 6, further comprising a heat sink coupled to the panel.

9. A mounting post of a contactor assembly comprising:
   a body including a first end connectable to an electrical contactor via a fastener and a second end connectable to a bus bar via another fastener, the body including an opening having a contactor-foil material disposed therein for contacting a portion of the electrical contactor and the bus bar receivable therein, wherein the contactor-foil material includes a plurality of fins extending at an angle to a surface of the contactor-foil material.

10. The mounting post of claim 9, wherein the body is formed from an electrically and thermally conductive material.

11. The mounting post of claim 9, wherein the contactor-foil material is wrapped about an inner periphery of the opening.

* * * * *